SEMICONDUCTOR DEVICE HAVING P-N JUNCTION DEFINED BY THE BOUNDARY BETWEEN TWO INTERSECTING SEMICONDUCTOR LAYERS
Filed Oct. 5, 1964

Inventor
CHRISTOPHER D. DOBSON
By [signature]
Attorney

United States Patent Office 3,337,374

Patented Aug. 22, 1967

3,337,374 SEMICONDUCTOR DEVICE HAVING P-N JUNCTION DEFINED BY THE BOUNDARY BETWEEN TWO INTERSECTING SEMICONDUCTOR LAYERS

Christopher David Dobson, London, England, assignor to International Standard Electric Corporation, New York, N.Y., a corporation of Delaware Filed Oct. 5, 1964, Ser. No. 401,554

Claims priority, application Great Britain, Nov. 27, 1963, 46,849/63

4 Claims. (Cl. 148—33.5)

ABSTRACT OF THE DISCLOSURE

The invention relates to a semiconductor device of a special construction and the method of making it. The device comprises an intrinsic body having two major intersecting surfaces in which a semiconductor layer is formed contiguous with one of the surfaces. A subsequent layer of opposite conductivity to the first layer is formed on the other surface of the intrinsic body and overlaps the edge of the first formed surface and forms at said edge a PN junction with the first formed layer.

This invention relates to a method of producing semiconductor junction devices.

According to the invention a method of producing a semiconductor junction device includes the steps of forming first and second layers of semiconductor material of opposite conductivity types in two planes at an angle to one another so that the transition region is bounded by an edge of the first layer and a face of the second layer.

One particular method according to the invention of producing a semiconductor junction device supported by an insulating substrate having at least one flat face includes the steps of forming a layer of semiconductor material of one conductivity type parallel and adjacent to the flat face, forming a second flat face at an angle to the first flat face, forming a second layer of semiconductor material, of the opposite conductivity to that of the first layer, parallel and adjacent to the second flat face so that a transition region is formed between the edge of the first layer and the face of the second layer, the first layer being provided with protective masking prior to the formation of the second layer.

The term "insulating substrate" as used in this specification is intended to include a body of intrinsic semiconductor material having a high specific resistivity.

It is possible by means of the invention to produce semiconductor junction devices in which the junction transition has a high length to width ratio.

Three stages in the production of a semiconductor junction device according to the invention will now be described with reference to perspective views of the device shown in FIGS. 1 to 3 of the accompanying drawings.

Figure 1:
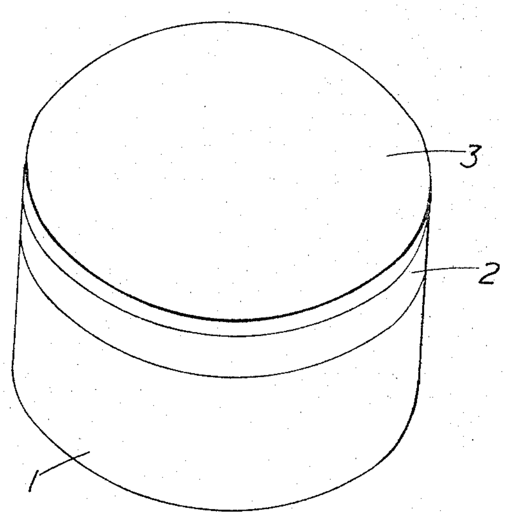
Figures 2, 3:
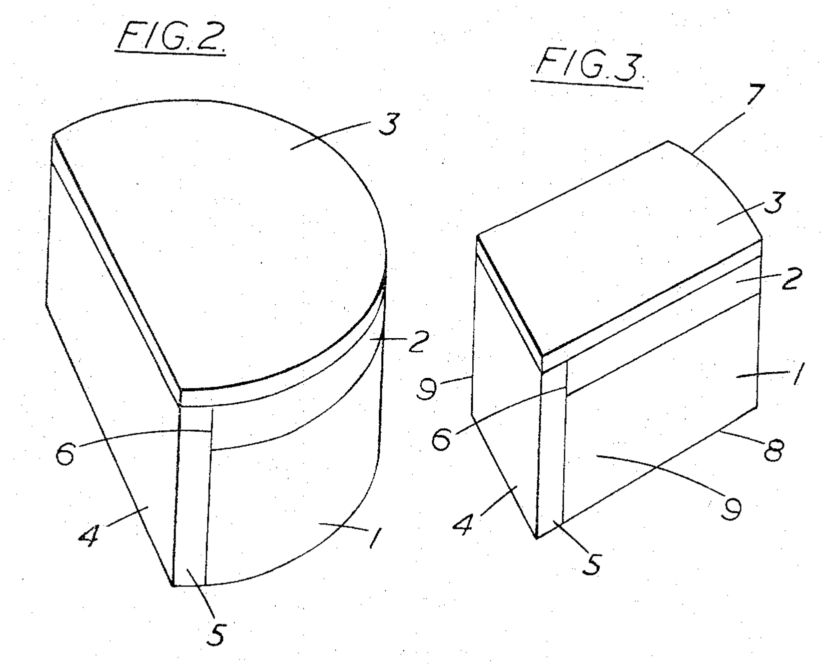

Referring to FIG. 1 a slice of semiconductor material 1 is provided with a layer 2 of N (or P) type semiconductor material parallel with and adjacent to one of its flat faces. The layer 2 is then provided with a protective masking layer 3 after which the slice 1 is cut to provide a second flat face 4 as shown in FIG. 2. This face is provided with a second layer of semiconductor material 5 which is of P (or N) type conductivity, i.e., of opposite conductivity to the first layer. At this stage a junction region 6 has been formed between the edge of the layer 2 and the inner face of the layer 5. This junction region has a width equal to the thickness of the layer 2 and a length equal to the length of the layer 4.

The final staps in producing the junction device are to cut the slice to produce a junction having the required length (the width of the junction having already been determined by the thickness of the layer 2). The slice is cut in two places at right angles to both the flat faces 3 and 4 to produce the finished device as shown in FIG. 3. In a typical device the junction region was 5 microns wide by 100 microns long.

Finishing of the device depends on the individual techniques used for masking and production of the layers 2 and 5. For example, if the entire slice is masked before being cut to produce surface 4 then no further processes are required beyond the provision of electrodes to the layers 2 and 5. However, if the masking is limited to the one layer 3 as shown in the drawings then the final devices as illustrated in FIG. 3 will require etching or other treatment to remove unwanted layers of semiconductor material formed during the formation of the layer 5, particularly on the surfaces 7 and 8.

The sequence of steps outlined above may be altered by, for instance, cutting the slices to produce the surface 4 before masking the layer 2. The cut slice is then masked to provide masking layer 3, but this may also mask the surface 4. Therefore etching of the surface 4 has to be carried out before the layer 5 can be formed.

Formation of the layers 2 and 5 may be by any conventional means such as diffusion of impurities into the intrinsic semiconductor material, or by epitaxial techniques, etc. Cutting of the slice may be performed by sawing, ultrasonic cutting, spark machining or cleaving. The latter technique is particularly useful in the construction of semiconductor lasers. For example, a semiconductor laser can be made from gallium arsenide (GaAs) having a flat P-N junction the ends of which are at right angles to optically flat surfaces, which thereby form an optical cavity. In such a case the intrinsic GaAs body 1, referring again to FIG. 1, is formed so that the top surface is parallel to the (100) type plane. After the first layer 2 has been formed the slice is cleft in the 110 plane to produce the face 4 which is perpendicular to the face in the 100 plane. After formation of the second layer 5 the slice is again cleft in the 110 plane to give two further faces 9 which are not only perpendicular to the top face but also perpendicular to the face 4. Thus the ends of the junction 6 are terminated by the parallel optically flat faces 9 at right angles to the plane of the junction.

It will be appreciated that other crystallographic planes can be utilized to achieve the same results.

In certain cases it may be desirable or expedient to form the junction 6 between a pair of layers 2 and 5 which are not at right angles to one another.

What I claim is:

1. A semiconductor device, comprising:

a body of intrinsic semiconductor material having first and second intersecting major surfaces;

a first layer of monocrystalline semiconductor material of one conductivity type adjacent said first major surface; and a second layer of opposite conductivity type monocrystalline semiconductor material adjacent said second major surface, said second layer overlying an edge of said first layer adjacent the intersection of said surfaces such that only the contiguous portions of said first and second layers at said edge define a P-N junction therebetween, the width of said junction being substantially equal to the thickness of the contiguous portion of said first layer.

2. A semiconductor device according to claim 1, wherein said surfaces are substantially planar in the vicinity of said intersection, said surfaces intersecting along a line such that the length of said line is substantially equal to the length of said junction.

3. A semiconductor device according to claim 2, wherein said first surface is normal to said second surface in the vicinity of said intersection such that said junction is substantially parallel to the adjacent portion of said second surface.

4. A semiconductor device according to claim 3, wherein said device is a laser, said body having two additional optically flat parallel surfaces normal to said junction.

References Cited

UNITED STATES PATENTS

| | | | |
|---|---|---|---|
| 3,008,089 | 7/1961 | Uhlir | 148—33.2 |
| 3,016,313 | 1/1962 | Pell | 148—33.2 |
| 3,100,276 | 8/1963 | Meyer | 148—33.5 |
| 3,103,455 | 9/1963 | John | 148—33.2 X |
| 3,146,135 | 8/1964 | Chih Tang Sah | 148—33.5 |
| 3,152,928 | 10/1964 | Hubner | 148—33.5 |

HYLAND BIZOT, *Primary Examiner.*